United States Patent
Kang et al.

(10) Patent No.: US 7,242,102 B2
(45) Date of Patent: Jul. 10, 2007

(54) BOND PAD STRUCTURE FOR COPPER METALLIZATION HAVING INCREASED RELIABILITY AND METHOD FOR FABRICATING SAME

(75) Inventors: Inkuk Kang, San Jose, CA (US); Hiroyuki Kinoshita, Sunnyvale, CA (US); Boon-Yong Ang, Cupertino, CA (US); Hajime Wada, San Jose, CA (US); Simon S Chan, Saratoga, CA (US); Cinti X Chen, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 2 days.

(21) Appl. No.: 10/887,585

(22) Filed: Jul. 8, 2004

(65) Prior Publication Data

US 2006/0006552 A1    Jan. 12, 2006

(51) Int. Cl.
  *H01L 23/48* (2006.01)
  *H01L 23/52* (2006.01)
  *H01L 29/40* (2006.01)
  *H01L 23/28* (2006.01)

(52) U.S. Cl. .................. 257/786; 257/773; 257/774; 257/E23.02

(58) Field of Classification Search .............. 257/786, 257/773, 774
See application file for complete search history.

(56) References Cited

U.S. PATENT DOCUMENTS 4,060,828 A * 11/1977 Satonaka ............... 257/774
5,248,903 A * 9/1993 Heim ..................... 257/748
5,284,797 A    2/1994 Heim
5,962,919 A * 10/1999 Liang et al. ............ 257/748
6,187,615 B1 * 2/2001 Kim et al. .............. 438/113
6,222,270 B1    4/2001 Lee
2001/0051426 A1   12/2001 Pozder et al.
2002/0006717 A1    1/2002 Yamaha
2003/0047794 A1    3/2003 Watanabe
2004/0142549 A1    7/2004 Yoo

FOREIGN PATENT DOCUMENTS

JP    2003 257969    9/2003

* cited by examiner

*Primary Examiner*—Nitin Parekh
(74) *Attorney, Agent, or Firm*—Farjami & Farjami LLP

(57) ABSTRACT

According to one exemplary embodiment, a structure in a semiconductor die comprises a metal pad situated in an interconnect metal layer, where the metal pad comprises copper. The structure further comprises an interlayer dielectric layer situated over the metal pad. The structure further comprises a terminal via defined in the interlayer dielectric layer, where the terminal via is situated on the metal pad. The terminal via extends along only one side of the metal pad. The structure further comprises a terminal metal layer situated on the interlayer dielectric layer and in the terminal via. The structure further comprises a dielectric liner situated on the terminal metal layer, where a bond pad opening is defined in the dielectric liner, and where the bond pad opening exposes a portion of the terminal metal layer. The interlayer dielectric layer is situated between the exposed portion of the terminal metal layer and metal pad.

7 Claims, 6 Drawing Sheets

US 7,242,102 B2

BOND PAD STRUCTURE FOR COPPER METALLIZATION HAVING INCREASED RELIABILITY AND METHOD FOR FABRICATING SAME

TECHNICAL FIELD

The present invention is generally in the field of semiconductor fabrication. More specifically, the present invention is in the field of fabrication of copper interconnect lines.

BACKGROUND ART

Semiconductor devices, such as flash memory devices as well as other types of memory devices, continue to increase in device density and speed while decreasing in size and power consumption. However, semiconductor devices, such as flash memory devices, having increased density and speed and decreased size and power consumption also require highly conductive and reliable interconnect lines. Consequently, copper ("Cu") metallization has become more desirable as a replacement for ("Al") based metallizations, since copper has a lower resistance, i.e. it is more conductive, as compared with aluminum. The lower resistance of copper enables signals in the semiconductor device to move faster by decreasing the RC time delay in the device's interconnect lines. Furthermore, since copper has a higher electromigration resistance compare to aluminum, copper interconnect lines can reliably handle higher current densities with thinner lines. However, copper is difficult to use in semiconductor manufacturing, since it, i.e. copper, diffuses very quickly in silicon and can damage active devices if it reaches the active area of the semiconductor die. As a result, copper interconnect lines must be surrounded by a diffusion barrier layer to block undesirable copper diffusion. Also, the particular characteristics of copper, such as copper's ability to readily oxidize, makes bonding to copper much more difficult than bonding to aluminum or gold. As a result, semiconductor manufacturers are challenged to provide effective copper bond pad structures for semiconductor devices, such as flash memory devices, which utilize copper metallization.

In a conventional bond pad structure utilized in copper metallization, a terminal metal structure comprising a layer of aluminum is situated over a diffusion barrier layer, which typically comprises tantalum ("Ta"), is formed over a copper metal pad. The layer of aluminum provides a reliable surface that readily accepts wire bonds, while the diffusion barrier layer effectively prevents copper from migrating to the layer of aluminum. However, during the stress of wire bonding, the diffusion barrier layer may develop cracks, which can allow copper to migrate to the aluminum layer and cause a bonding failure.

Thus, there is a need in the art for a more reliable bond pad structure for semiconductor devices, such as flash memory devices, utilizing copper metallization.

SUMMARY

The present invention is directed to bond pad structure for copper metallization having increased reliability and method for fabricating same. The present invention addresses and resolves the need in the art for a more reliable bond pad structure for semiconductor devices, such as flash memory devices, utilizing copper metallization.

According to one exemplary embodiment, a structure in a semiconductor die comprises a metal pad situated in an interconnect metal layer, where the metal pad comprises copper. The structure further comprises an interlayer dielectric layer situated over the metal pad. The interlayer dielectric layer can be TEOS oxide, for example. The structure further comprises a terminal via defined in the interlayer dielectric layer, where the terminal via is situated on the metal pad, and where the terminal via extends along only one side of the metal pad. The structure further comprises a terminal metal layer situated on the interlayer dielectric layer and in the terminal via. The terminal metal layer comprises a contact metal layer and a barrier layer, where the barrier layer is situated on the interlayer dielectric layer. For example, the contact metal layer can comprise aluminum and the barrier layer can comprise tantalum.

According to this exemplary embodiment, the structure further comprises a dielectric liner situated on the terminal metal layer. The structure further comprises a bond pad opening defined in the dielectric liner, where the bond pad opening exposes a portion of the terminal metal layer, and where the interlayer dielectric layer is situated between the exposed portion of the terminal metal layer and the metal pad.

According to one embodiment, the terminal via can extend along four sides of the metal pad. According to one embodiment, the invention is a method for achieving the above-described interconnect structure. Other features and advantages of the present invention will become more readily apparent to those of ordinary skill in the art after reviewing the following detailed description and accompanying drawings.

DETAILED DESCRIPTION OF THE INVENTION

Figure 1A:
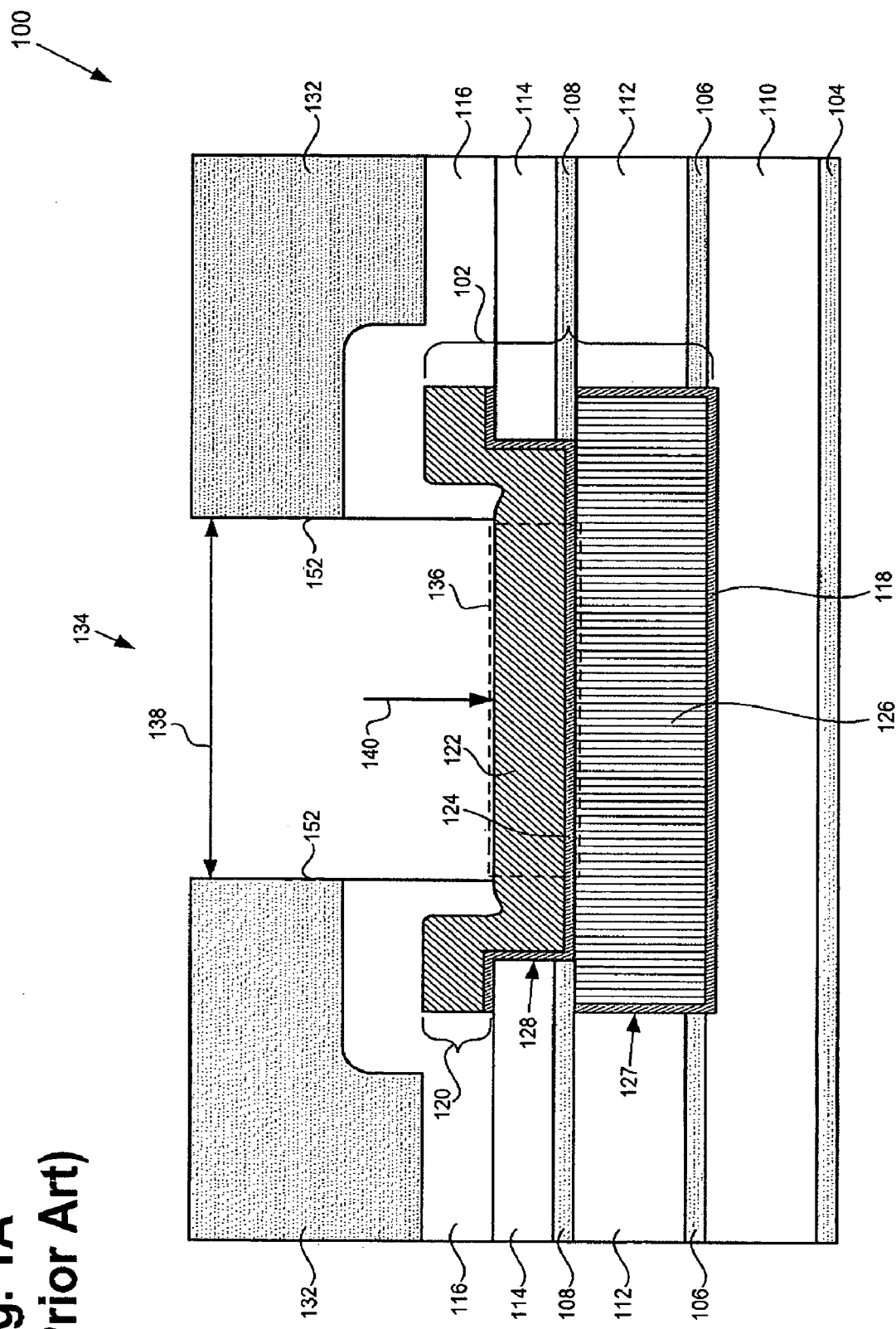
FIG. 1A illustrates a cross-sectional view of an exemplary structure including an exemplary conventional bond pad structure.

The present invention is directed to bond pad structure for copper metallization having increased reliability and method for fabricating same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It is noted that, for ease of illustration, the various elements and dimensions shown in the drawings are not drawn to scale.

FIG. 1A shows a cross-sectional view of an exemplary structure including an exemplary conventional bond pad structure. Structure 100 includes conventional bond pad structure 102, intermediate dielectric layers 104, 106, and 108, interlayer dielectric ("ILD") layers 110, 112, and 114, dielectric liner 116, barrier layer 118, and topside dielectric layer 132. Conventional bond pad structure 102 includes terminal metal layer 120, which includes contact metal layer 122 and barrier layer 124, and metal pad 126. Structure 100 can be a portion of an interconnect metal structure in a semiconductor device, such as a flash memory device or other type of memory device, which utilizes copper metallization.

As shown in FIG. 1A, ILD layer 110 is situated on intermediate dielectric layer 104. Intermediate dielectric layer 104 can comprise silicon nitride and can be formed by using a chemical vapor deposition ("CVD") process. ILD layer 110 can comprise tetraethylorthosilicate ("TEOS") oxide and can be formed over intermediate dielectric layer 104 by using a CVD process. Also shown in FIG. 1A, intermediate dielectric layer 106 is situated on ILD layer 110 and ILD layer 112 is situated on intermediate dielectric layer 106. Intermediate dielectric layer 106 and ILD layer 112 are substantially similar in composition, thickness, and formation to intermediate dielectric layer 104 and ILD layer 110, respectively. Further shown in FIG. 1A, barrier layer 118 is situated on sidewalls and bottom surface of trench 126, which is formed by patterning and etching an opening in ILD layer 112 and intermediate dielectric layer 106. Barrier layer 118 can comprise tantalum and can be formed on sidewalls and bottom surface of trench 127 by using a physical vapor deposition ("PVD") process. Also shown in FIG. 1A, metal pad 126 is situated on barrier layer 118 in trench 127 and comprises copper. Metal pad 126 can be formed by depositing copper in trench 127 by using a CVD process or other appropriate processes. Metal pad 126 can be formed in interconnect metal layer three, which is also referred to as "M3."

Further shown in FIG. 1A, intermediate dielectric layer 108 is situated on ILD layer 112 and ILD layer 114 is situated on intermediate dielectric layer 108. Intermediate dielectric layer 108 is substantially similar in composition, thickness, and formation to intermediate dielectric layers 104 and 106. ILD layer 114 is substantially similar in composition and formation to ILD layers 110 and 112. Also shown in FIG. 1A, terminal metal layer 120 is situated on ILD layer 114 and in terminal via 128, which is situated on metal pad 126. Terminal via 128 can be formed by patterning and etching a hole in ILD layer 114 and intermediate dielectric layer 108. Terminal metal layer 120 includes barrier layer 124, which is situated on the sidewalls and bottom surface of terminal via 128, and contact metal layer 122, which is situated on barrier layer 124. Barrier layer 124 can comprise tantalum and can be formed by a PVD process. Contact metal layer 122 can comprise aluminum with 0.5% copper and can be formed by a PVD process.

Further shown in FIG. 1A, dielectric liner 116 is situated on ILD 114 and terminal metal layer 120. Dielectric liner 116 can comprise TEOS oxide and can be deposited by using a CVD process. Also shown in FIG. 1A, topside dielectric layer 132 is situated over dielectric liner 116, can comprise silicon nitride, and can be formed by using a CVD process. Further shown in FIG. 1A, bond pad opening 134 is situated in topside dielectric layer 132 and dielectric liner 116 and exposes portion 136 of terminal metal layer 120, which is situated between sidewalls 152 of bond pad opening 134. Bond pad opening 134 can be formed by patterning and etching a hole in topside dielectric layer 132 and dielectric liner 116 and has width 138, which can be approximately 76.0 microns.

During a wire bonding procedure, which is performed to attach a bond wire to bond pad structure 102, a downward force, which is represented by arrow 140, is applied to exposed portion 136 of terminal metal layer 120. Stress caused by the downward force applied to the exposed portion, i.e. portion 136, of terminal metal layer 120, can cause cracks in terminal metal layer 120, including barrier layer 124. Thus, since the exposed portion of terminal metal layer 120 is situated directly on metal pad 126 in conventional bond pad structure 102, copper in metal pad 126 can migrate to terminal metal layer 120 and cause a wire bonding failure.

Figure 1B:
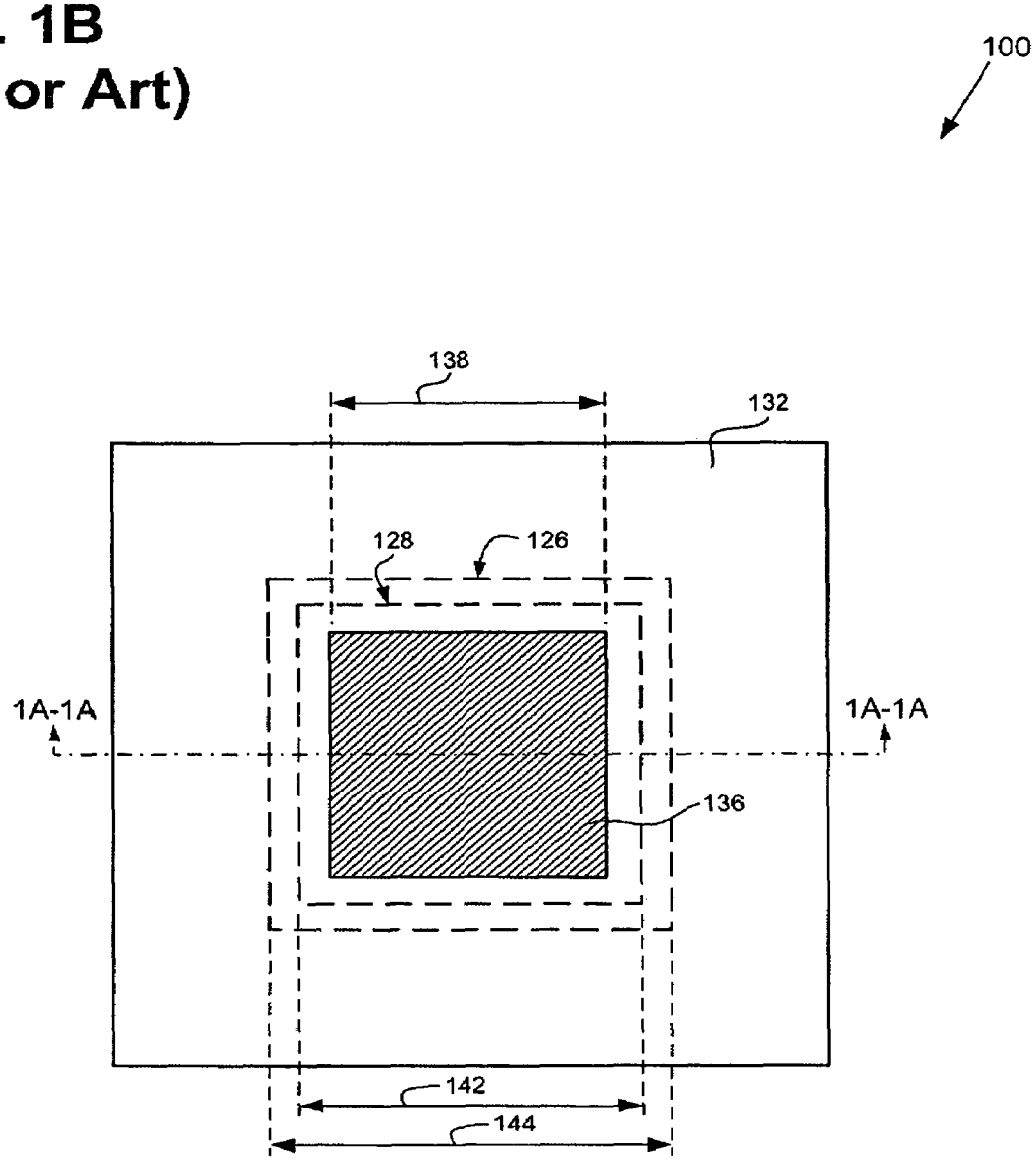
FIG. 1B illustrates a top view of the exemplary structure of FIG. 1A.

FIG. 1B shows a top view of structure 100, where the cross-sectional view of structure 100 in FIG. 1A is across line A-A in FIG. 1B. In particular, metal pad 126, terminal via 128, portion 136 of terminal metal layer 120, and width 138 of bond pad opening 134 correspond to the same elements in FIG. 1A and FIG. 1B. As shown in FIG. 1B, terminal via 128 has width 142, which can be approximately 80.0 Angstroms, and metal pad 126 has width 144, which can be approximately 82.0 Angstroms. Thus, as shown in FIG. 1B, terminal via 128 is situated on a substantial portion of metal pad 126.

Figure 2A:
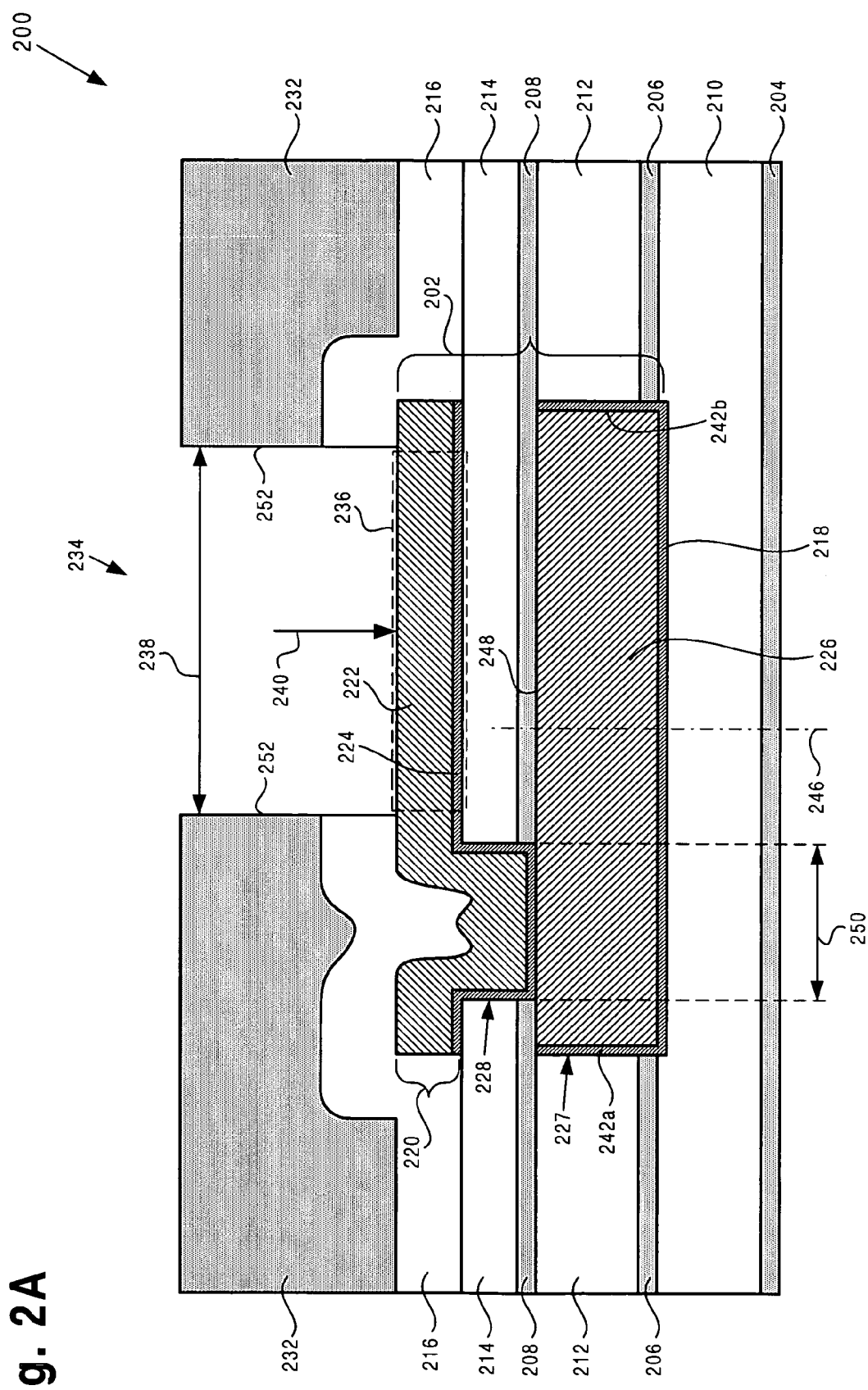
FIG. 2A illustrates a cross-sectional view of an exemplary structure including exemplary bond pad structure, in accordance with one embodiment of the present invention.

FIG. 2A shows a cross-sectional view of an exemplary structure including an exemplary bond pad structure, in accordance with one embodiment of the present invention. Structure 200 includes bond pad structure 202, intermediate dielectric layers 204, 206, and 208, ILD layers 210, 212, and 214, dielectric liner 216, barrier layer 218, terminal via 228, and topside dielectric layer 232. Bond pad structure 202 includes terminal metal layer 220, which includes contact metal layer 222 and barrier layer 224, and metal pad 226. Structure 200 can be a portion of an interconnect structure in a semiconductor device, such as a flash memory device or other type of memory device, which utilizes copper metallization.

As shown in FIG. 2A, ILD layer 210 is situated on intermediate dielectric layer 204. Intermediate dielectric layer 204 can be situated over an interconnect metal layer (not shown in FIG. 2A) or a dielectric layer in a semiconductor die and can comprise silicon nitride or other appropriate dielectric. Intermediate dielectric layer 204 can be formed by using a CVD process or other appropriate processes and can a thickness of approximately 500.0 Angstroms ±50.0 Angstroms. ILD layer 210 can comprise TEOS oxide or other appropriate dielectric and can be formed over intermediate dielectric layer 104 by using a CVD process or other appropriate processes. Also shown in FIG. 2A, intermediate dielectric layer 206 is situated on ILD layer 210 and ILD layer 212 is situated on intermediate dielectric layer 206. Intermediate dielectric layer 206 is substantially similar in composition, thickness, and formation to intermediate dielectric layer 204 and ILD layer 212 is substantially similar in composition, thickness, and formation to ILD layer 210.

Further shown in FIG. 2A, barrier layer 218 is situated on sidewalls and bottom surface of trench 227, which is formed by patterning and etching an opening in ILD layer 212 and intermediate dielectric layer 206 by using an appropriate etch process. Barrier layer 218 can comprise tantalum or other appropriate copper diffusion barrier material and can have a thickness of approximately 250.0 Angstroms ±25.0 Angstroms. Barrier layer 218 can be formed on sidewalls and bottom surface of trench 227 by using a PVD process or other appropriate processes. Also shown in FIG. 2A, metal pad 226 is situated on barrier layer 218 in trench 227 and comprises copper. Metal pad 226 can be formed by depositing copper in trench 227 by using a CVD process, an electroplating process, or other appropriate processes. By way of example, metal pad 226 can have a thickness of approximately 2500.0 Angstroms±375.0 Angstroms. Metal pad 226 is situated in the top interconnect metal layer of the semiconductor die. By way of example, metal pad 226 can be situated in interconnect metal layer three, i.e. "M3."

Further shown in FIG. 2A, intermediate dielectric layer 208 is situated on ILD layer 212 and metal pad 226 and ILD layer 214 is situated on intermediate dielectric layer 208. Intermediate dielectric layer 208 is substantially similar in composition, thickness, and formation to intermediate dielectric layers 204 and 206. ILD layer 214 is substantially similar in composition and formation to ILD layers 210 and 212. By way of example, ILD layer 214 can have a thickness of approximately 5500.0 Angstroms±550.0 Angstroms. Also shown in FIG. 2A, terminal via 228 is situated in ILD layer 214 and intermediate dielectric layer 208 and on metal pad 226. In the embodiment of the present invention in FIG. 2A, terminal via 228 is situated adjacent to side 242a of metal pad 226 but not situated adjacent to opposing side 242b of metal pad 226. Thus, terminal via 228 is "offset" from centerline 246 of metal pad 226, which extends in a direction perpendicular to top surface 248 of metal pad 226. In other embodiments, terminal via 228 may be situated along two or more sides of metal pad 226. Terminal via 228 can be formed by appropriately patterning and etching a hole in ILD layer 214 and intermediate dielectric layer 208 by using an etch process as known in the art. By way of example, width 250 of terminal via 228 can be approximately 3.0 microns.

Also shown in FIG. 2A, terminal metal layer 220 is situated in terminal via 228 and on ILD layer 214. Terminal metal layer 220 includes barrier layer 224, which is situated on the sidewalls and bottom surface of terminal via 228 and ILD layer 214, and contact metal layer 222, which is situated on barrier layer 224. Barrier layer 224 can comprise tantalum or other appropriate material and can be formed on sidewalls and bottom surface of terminal via 228 and ILD layer 214 by a PVD process or other appropriate processes. By way of example, barrier layer 224 can have a thickness of approximately 500.0 Angstroms ±50.0 Angstroms. Contact metal layer 222 can comprise aluminum with 0.5% copper and can be formed on barrier layer 224 by a PVD process or other appropriate processes. In other embodiments, contact metal layer 222 may comprise aluminum with a percent of copper different than 0.5%. By way of example, contact metal layer 222 can have a thickness of approximately 6500.0 Angstroms ±650.0 Angstroms. After the barrier and contact metal layers have been deposited in terminal via 228 and on ILD layer 214, they, i.e. the barrier and contact metal layers, can be appropriately patterned and etched to form terminal metal layer 220. Terminal metal layer 220 is electrically connected to metal pad 226 by terminal via 228.

Further shown in FIG. 2A, dielectric liner 216 is situated on ILD 214 and terminal metal layer 220. Dielectric liner 216 can comprise TEOS oxide or other appropriate dielectric and can be deposited by using a CVD process or other appropriate processes. By way of example, dielectric liner 216 can have a thickness of approximately 5000.0 Angstroms ±500.0 Angstroms. Also shown in FIG. 2A, topside dielectric layer 232 is situated over dielectric liner 216 and can comprise silicon nitride or other appropriate dielectric and can be formed by using a CVD process. By way of example, topside dielectric layer 232 can have a thickness of approximately 10,000.0 Angstroms ±1000.0 Angstroms. Further shown in FIG. 2A, bond pad opening 234 is situated in topside dielectric layer 232 and dielectric liner 216 and exposes portion 236 of terminal metal layer 220, which is situated between sidewalls 252 of bond pad opening 234. Bond pad opening 234 can be formed by appropriately patterning and etching a hole in topside dielectric layer 232 and dielectric liner 216. By way of example, width 238 of bond pad opening 234 can be approximately 76.0 microns.

Figure 2B:
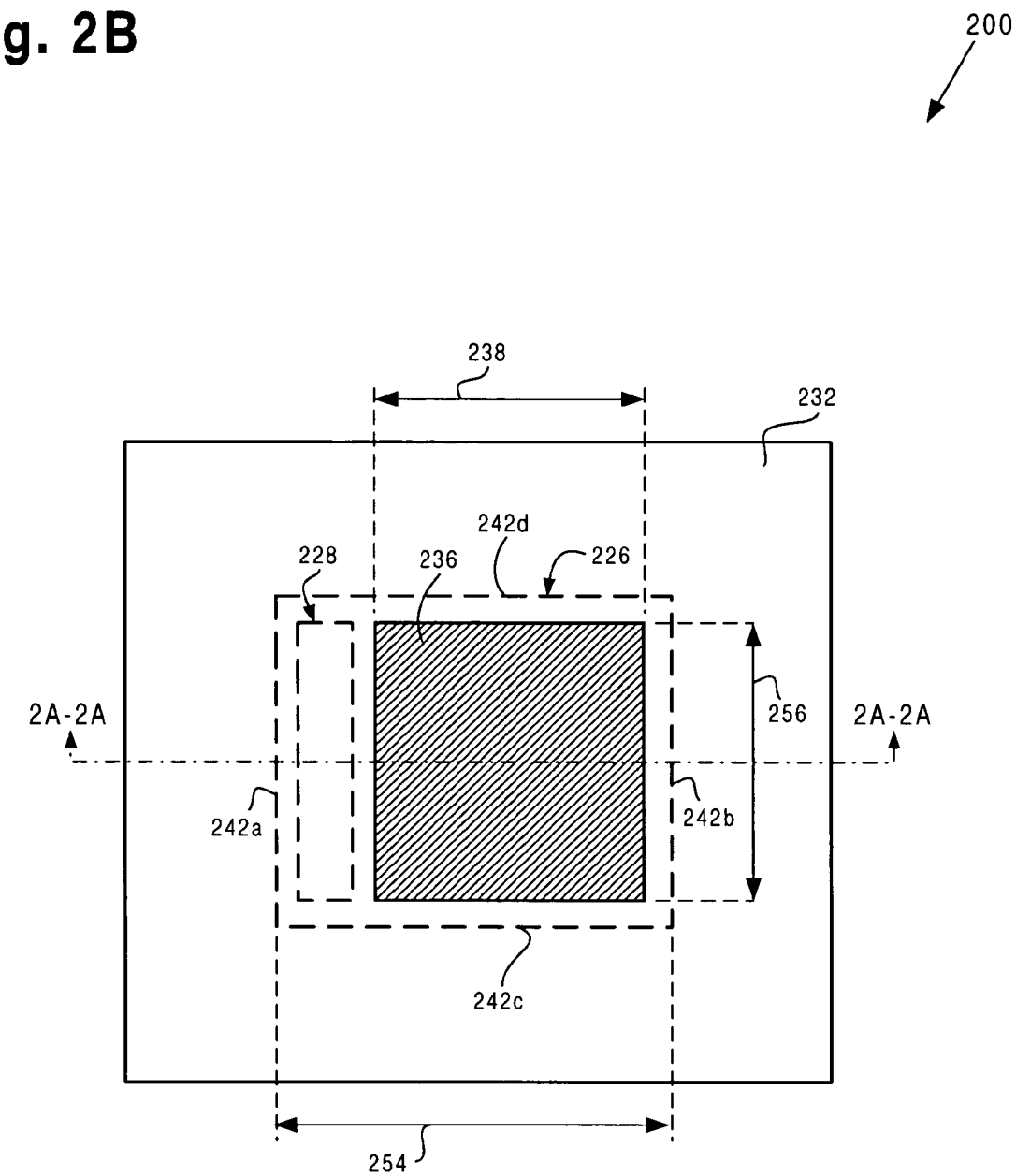
FIG. 2B illustrates a top view of the exemplary structure of FIG. 2A.

FIG. 2B shows a top view of structure 200, where the cross-sectional view of structure 200 in FIG. 2A is across line 2A-2A in FIG. 2B. In particular, metal pad 226, terminal via 228, topside dielectric layer 232, portion 236 of terminal metal layer 220, width 238 of bond pad opening 234 and sides 242 and 244 of metal pad 226 correspond to the same elements in FIG. 2A and FIG. 2B. As shown in FIG. 2B, terminal via 128 has width 142, which can be approximately 80.0 Angstroms, and metal pad 126 has width 254 and depth 256. By way of example, width 254 can be approximately 85.0 Angstroms and depth 256 can be approximately 80.0 Angstroms. Also shown in FIG. 2B, terminal via 228 extends along only one side, i.e. side 242a, of metal pad 226, which has additional sides 242b, 242c, and 242d.

Thus, in the embodiment of the present invention in FIGS. 2A and 2B, by offsetting terminal via 228, i.e. by situating terminal via 228 adjacent to side 242a of metal pad 226, the present invention achieves a bond pad structure, i.e. bond pad structure 202 having ILD layer 214 and barrier layer 208 situated between portion 236 of terminal metal layer 220 and metal pad 226. As a result, if the exposed portion, i.e. portion 236, of terminal metal layer 220 is damaged by cracks caused by a downward force, which is represented by arrow 240 in FIG. 2A, applied to portion 236 during a wire bonding procedure, ILD layer 214 and barrier layer 208 prevent copper in metal pad 226 from migrating to terminal metal layer 220 and causing a wire bonding failure. In contrast, in conventional bond pad structure 102 in FIG. 1A, since the exposed portion, i.e. portion 136, of terminal metal layer 120 is in direct contact with metal pad 126, any cracks caused in terminal metal layer 120 during a wire bonding procedure can allow copper in metal pad 126 to migrate to terminal metal layer 120 and, thereby, cause a bonding failure. Thus, in the embodiment of the present invention in FIGS. 2A and 2B, by utilizing an offset terminal via, the present invention advantageously achieves a bond pad structure for copper metallization having increased reliability.

Figure 3A:
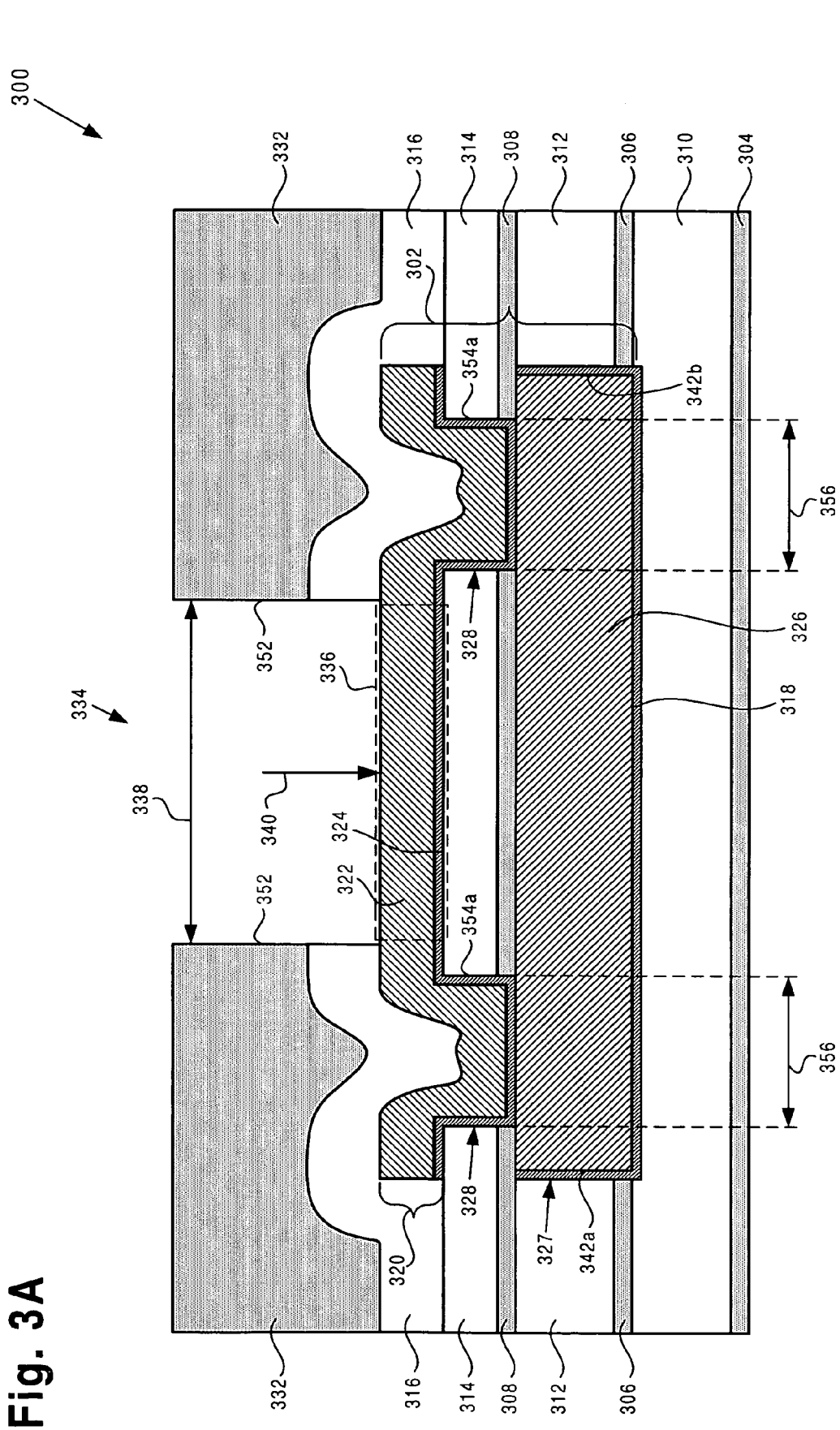
FIG. 3A illustrates a cross-sectional view of an exemplary structure including exemplary bond pad structure, in accordance with one embodiment of the present invention.

FIG. 3A shows a cross-sectional view of an exemplary structure including an exemplary bond pad structure, in accordance with one embodiment of the present invention. In FIG. 3A, intermediate dielectric layers 304, 306, and 308, ILD layers 310, 312, and 314, dielectric liner 316, barrier layers 318 and 324, metal pad 326, trench 327, topside dielectric layer 332, width 338, and sides 342 and 344 in structure 300 correspond, respectively, to intermediate dielectric layers 204, 206, and 208, ILD layers 210, 212, and 214, dielectric liner 216, barrier layers 218 and 224, metal pad 226, trench 227, topside dielectric layer 232, width 238, and sides 242 and 244 in structure 200 in FIG. 2A. Structure 300 includes bond pad structure 302, which includes terminal metal layer 320 and metal pad 326. Terminal metal layer 320 includes contact metal layer 322 and barrier layer 324. Structure 300 can be a portion of an interconnect metal structure in a semiconductor device, such as a flash memory device or other type of memory device, which utilizes copper metallization.

As shown in FIG. 3A, ILD layer 310 is situated on intermediate dielectric layer 304. Intermediate dielectric layer 304 can be situated over an interconnect metal layer (not shown in FIG. 3A) or a dielectric layer in a semiconductor die. Intermediate dielectric layer 304 and ILD layer 310 are substantially similar in composition, thickness, and formation to intermediate dielectric layer 204 and ILD layer 210 in FIG. 2A, respectively. Also shown in FIG. 3A, intermediate dielectric layer 306 is situated on ILD layer 310 and ILD layer 312 is situated on intermediate dielectric layer 306. Intermediate dielectric layer 306 and ILD layer 312 are substantially similar in composition, thickness, and formation to intermediate dielectric layer 304 and ILD layer 310, respectively.

Further shown in FIG. 3A, barrier layer 318 is situated on sidewalls and bottom surface of trench 327, which is formed by patterning and etching an opening in ILD layer 312 and intermediate dielectric layer 306 by using an appropriate etch process. Barrier layer 318 is substantially similar in composition, thickness, and formation to barrier layer 218 in FIG. 2A. Also shown in FIG. 3A, metal pad 326 is situated on barrier layer 318 in trench 327 and comprises copper. Metal pad 326 is substantially similar to metal pad 226 in thickness and formation. Metal pad 326 is situated in the top interconnect metal layer of the semiconductor die. By way of example, metal pad 326 can be situated in interconnect metal layer three, i.e. "M3."

Further shown in FIG. 3A, intermediate dielectric layer 308 is situated on ILD layer 312 and metal pad 326 and ILD layer 314 is situated on intermediate dielectric layer 308. Intermediate dielectric layer 308 is substantially similar in composition, thickness, and formation to intermediate dielectric layers 304 and 306 and ILD layer 314 is substantially similar in composition and formation to ILD layers 310 and 312. Also shown in FIG. 3A, segments 354a and 354b of terminal via 328 are situated in ILD layer 314 and intermediate dielectric layer 308 and on metal pad 326. Segments 354a and 354b of terminal via 328 are also situated adjacent to respective sides 342 and 344 of metal pad 326. Segments 354a and 354b of terminal via 328 can be formed by appropriately patterning and etching holes in ILD layer 314 and intermediate dielectric layer 308 by using an appropriate etch process. By way of example, width 356 of segments 354a and 354b can be approximately 3.0 microns. Terminal via 328 will be further discussed in relation to FIG. 3B.

Also shown in FIG. 3A, terminal metal layer 320 is situated in segments 354a and 354b of terminal via 328 and on ILD layer 314. Terminal metal layer 320 includes barrier layer 324, which is situated on the sidewalls and bottom surfaces of segments 354a and 354b of terminal via 328 and on ILD layer 314, and contact metal layer 322, which is situated on barrier layer 324. Barrier layer 324 can comprise tantalum or other appropriate material and can be formed on sidewalls and bottom surfaces of segments 354a and 354b of terminal via 328 and on ILD layer 314 by a PVD process or other appropriate processes. By way of example, barrier layer 324 can have a thickness of approximately 500.0 Angstroms ±50.0 Angstroms. Contact metal layer 322 can comprise aluminum with 0.5% copper and can be formed on barrier layer 324 by a PVD process or other appropriate processes. In other embodiments, contact metal layer 322 may comprise aluminum with a percent of copper different than 0.5%. By way of example, contact metal layer 322 can have a thickness of approximately 6500.0 Angstroms ±650.0 Angstroms. After the barrier and contact metal layers have been deposited in segments 354a and 354b of terminal via 328 and on ILD layer 314, they, i.e. the barrier and contact metal layers, can be appropriately patterned and etched to form terminal metal layer 320. Terminal metal layer 320 is electrically connected to metal pad 326 by terminal via 328.

Further shown in FIG. 3A, dielectric liner 316 is situated on ILD 314 and terminal metal layer 320. Dielectric liner 316 is substantially similar in composition, thickness, and formation to dielectric liner 216 in FIG. 2A. Also shown in FIG. 3A, topside dielectric layer 332 is situated over dielectric liner 316 and is substantially similar in composition, thickness, and formation to topside dielectric layer 232 in FIG. 2A. Further shown in FIG. 3A, bond pad opening 334 is situated in topside dielectric layer 332 and dielectric liner 316 and exposes portion 336 of terminal metal layer 320, which is situated between sidewalls 352 of bond pad opening 334. Bond pad opening 234 can be formed by appropriately patterning and etching a hole in topside dielectric layer 332 and dielectric liner 316. By way of example, width 338 of bond pad opening 334 can be approximately 76.0 microns.

Figure 3B:
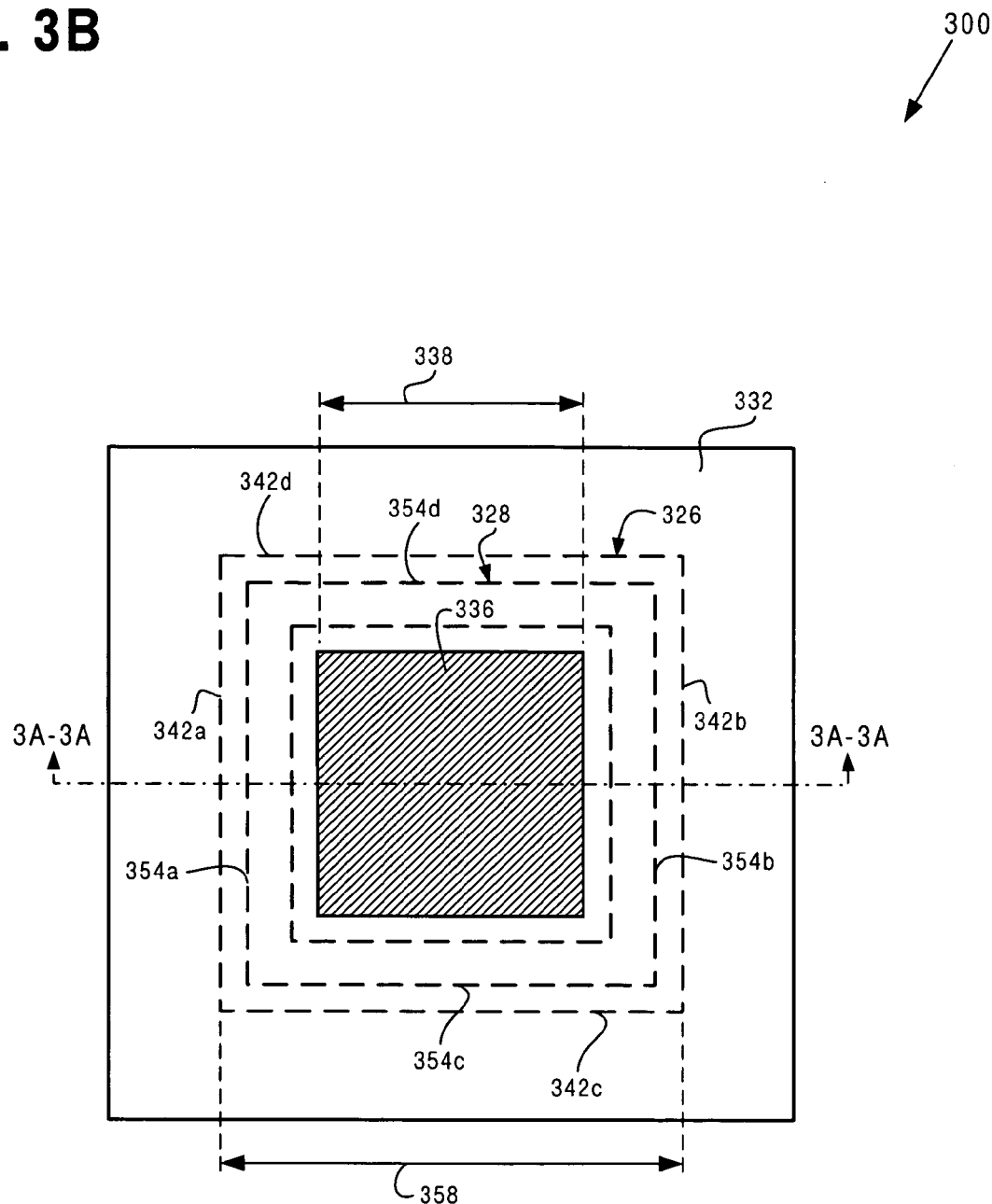
FIG. 3B illustrates a top view of the exemplary structure of FIG. 3A.

FIG. 3B shows a top view of structure 300, where the cross-sectional view of structure 300 in FIG. 3A is across line 3A-3A in FIG. 3B. In particular, metal pad 326, terminal via 328, topside dielectric layer 332, portion 336 of terminal metal layer 320, width 338 of bond pad opening 334, sides 342 and 344 of metal pad 326 and segments 354a ad 354b correspond to the same elements in FIG. 3A and FIG. 3B. As shown in FIG. 3B, terminal via 328 comprises segments 354a, 354b, 354c, and 354d, which are situated along, i.e. adjacent to, sides 342a, 342b, 342c, and 342d of metal pad 326, respectively. Thus, in the embodiment of the present invention in FIGS. 3A and 3B, terminal via 328 extends along the sides of metal pad 326 and surrounds portion 336 of terminal metal layer 320, which is exposed in bond pad opening 334. Also shown in FIG. 3B, metal pad 326 has width 358, which can be, for example, approximately 88.0 microns.

Thus, in the embodiment of the present invention in FIGS. 3A and 3B, by forming terminal via 328 along the sides of metal pad 326, the present invention achieves a bond pad structure, i.e. bond pad structure 302, having ILD layer 314 and barrier layer 308 situated between exposed portion 336 of terminal metal layer 320 and metal pad 326. Thus, similar to the embodiment of the present invention in FIGS. 2A and 2B, if the exposed portion, i.e. exposed portion 336, of terminal metal layer 320 is damaged by cracks caused by a downward force, which is represented by arrow 340, applied to portion 336 of terminal metal layer 320 during a wire bonding procedure, ILD layer 314 and barrier layer 308, which are situated under exposed portion 336, prevent copper in metal pad 326 from migrating to terminal metal layer 320 and, thereby, causing a wire bonding failure. Thus, similar to the embodiment of the present invention in FIGS. 2A and 2B, the embodiment of the present invention in FIGS. 3A and 3B also advantageously achieves a bond pad structure for copper metallization having increased reliability.

Additionally, since terminal via 228 in FIGS. 2A and 2B is situated along one side of metal pad 226 while terminal via 338 in FIGS. 3A and 3B is situated along all four sides of metal pad 326, terminal via 338 is significantly larger terminal via 228. Since a larger via, when filled with a similar material, can provide a lower resistance than a smaller via, the embodiment of the present invention in FIGS. 3A and 3B achieves a bond pad structure having decreased resistance compared to the bond pad structure in the embodiment of the present invention in FIGS. 2A and 2B.

Thus, as discussed above, in the embodiments of the present invention in FIGS. 2A, 2B, 3A, and 3B, the present invention provides a bond pad structure having an ILD layer and an intermediate dielectric layer situated between an exposed portion of a terminal metal layer and a copper pad, where the ILD layer and the intermediate dielectric layer can prevent copper from migrating to the terminal metal layer and causing a wire bonding failure. As a result, the present invention advantageously achieves a bond pad structure copper metallization having increased reliability.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, bond pad structure for copper metallization having increased reliability and method for fabricating same have been described.

The invention claimed is:

1. A structure in a semiconductor die, said structure comprising:
   a metal pad situated in an interconnect metal layer, said metal pad comprising copper;
   an interlayer dielectric layer situated over said metal pad;
   a terminal via defined in said interlayer dielectric layer, said terminal via being situated on said metal pad;
   a terminal metal layer situated on said interlayer dielectric layer and in said terminal via, said terminal via forming a via ring around said metal pad, said terminal metal layer filling in said via ring, and said via ring and said terminal metal layer making contact with said metal pad;
   a dielectric liner situated on said terminal metal layer, wherein said terminal metal layer comprises a contact metal layer and a barrier layer, said barrier layer being situated on said interlayer dielectric layer;
   a bond pad opening defined in said dielectric liner, said bond pad opening exposing a portion of said terminal metal layer;
   wherein said interlayer dielectric layer is situated between said portion of said terminal metal layer and said metal pad, said interlayer dielectric layer being enclosed by said via ring, whereby said interlayer dielectric layer blocks and prevents diffusion of copper from said metal pad into said terminal metal layer.

2. The structure of claim 1 further comprising an intermediate dielectric layer situated between said interlayer dielectric layer and said metal pad.

3. The structure of claim 1 wherein said contact metal layer comprises aluminum.

4. The structure of claim 1 wherein said interlayer dielectric layer comprises TEOS oxide.

5. The structure of claim 1 wherein said barrier layer comprises tantalum.

6. A structure situated in a semiconductor die, said structure comprising:
   a metal pad situated in an interconnect metal layer, said metal pad comprising copper;
   an interlayer dielectric layer situated over said metal pad;
   an intermediate dielectric layer situated over said interlayer dielectric layer;
   a terminal via defined in said interlayer dielectric layer and said intermediate dielectric layer, said terminal via being situated on said metal pad;
   a terminal metal layer situated on said interlayer dielectric layer and in said terminal via, said terminal via forming a via ring around said metal pad, said terminal metal layer filling in said via ring, and said via ring and said terminal metal layer making contact with said metal pad, wherein said terminal metal layer comprises a contact metal layer situated on a barrier layer;
   a dielectric liner situated on said terminal metal layer;
   a bond pad opening defined in said dielectric liner, said bond pad opening exposing a portion of said terminal metal layer;
   wherein said interlayer dielectric layer and said intermediate dielectric layer are situated between said portion of said terminal metal layer and said metal pad, said interlayer dielectric layer being enclosed by said via ring, whereby said interlayer dielectric layer blocks and prevents diffusion of copper from said metal pad into said terminal metal layer.

7. The structure of claim 6 wherein said intermediate dielectric layer comprises silicon nitride.

* * * * *